United States Patent
Kang et al.

(10) Patent No.: US 10,483,332 B2
(45) Date of Patent: Nov. 19, 2019

(54) FLEXIBLE DISPLAY DEVICE AND METHOD OF MANUFACTURING THE SAME

(71) Applicant: LG Display Co., Ltd., Seoul (KR)

(72) Inventors: Sin-Chul Kang, Goyang-si (KR); Hye-Sun Son, Seoul (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 15/857,923

(22) Filed: Dec. 29, 2017

(65) Prior Publication Data

US 2018/0190734 A1   Jul. 5, 2018

(30) Foreign Application Priority Data

Dec. 30, 2016   (KR) .......................... 10-2016-0184085

(51) Int. Cl.
*G06F 3/041* (2006.01)
*H01L 27/32* (2006.01)
(Continued)

(52) U.S. Cl.
CPC ............ *H01L 27/3223* (2013.01); *B32B 7/12* (2013.01); *B32B 17/04* (2013.01); *G06F 3/041* (2013.01);
(Continued)

(58) Field of Classification Search
CPC ... H01L 27/32; H01L 27/3223; H01L 27/323; H01L 51/524; H01L 51/5246;
(Continued)

(56) References Cited

U.S. PATENT DOCUMENTS

2014/0061597 A1* 3/2014 Choi .................. H01L 51/5284
                                                          257/40
2014/0232956 A1* 8/2014 Kwon ............... G02F 1/133305
                                                          349/12
(Continued)

FOREIGN PATENT DOCUMENTS

CN   103150965 B   4/2015
TW   201640593 A   11/2016

OTHER PUBLICATIONS 5 pages of translation for Chinese Pub. No. CN103150965 B, Apr. 29, 2015.*

(Continued)

*Primary Examiner* — Joe H Cheng
(74) *Attorney, Agent, or Firm* — Morgan, Lewis & Bockius LLP

(57) ABSTRACT

A flexible display device includes a first base having an active area and a dead area surrounding the active area, the first base including a pad portion provided in the dead area on one side of the active area; an array in the active area of the first base; an encapsulation layer configured to cover the array; a second base opposite to the first base; a touch electrode array on the second base to be opposite to the active area of the first base; a plurality of path holes in the dead area on at least one of the other sides of the active area on which the pad portion is not located; an inorganic dummy pattern spaced apart from the encapsulation layer among the path holes in a plane; and an adhesive layer between the encapsulation layer and the touch electrode array to fill the path holes.

19 Claims, 13 Drawing Sheets

(51) Int. Cl.
*B32B 7/12* (2006.01)
*B32B 17/04* (2006.01)
*H01L 51/52* (2006.01)
*G06F 3/044* (2006.01)

(52) U.S. Cl.
CPC .......... *G06F 3/0416* (2013.01); *H01L 27/323* (2013.01); *H01L 51/524* (2013.01); *G06F 3/044* (2013.01); *G06F 2203/04102* (2013.01); *G06F 2203/04103* (2013.01); *H01L 27/3244* (2013.01); *H01L 2251/5338* (2013.01)

(58) Field of Classification Search
CPC ............. H01L 2251/5338; G06F 3/041; G06F 2203/04102; G06F 2203/04103; B32B 7/12; B32B 17/04
See application file for complete search history.

(56) References Cited

U.S. PATENT DOCUMENTS

| | | | |
|---|---|---|---|
| 2016/0284770 A1* | 9/2016 | Kim | H01L 27/3258 |
| 2016/0315284 A1* | 10/2016 | Jeon | H01L 51/5246 |
| 2017/0025640 A1* | 1/2017 | Kim | H01L 51/5256 |
| 2017/0069692 A1* | 3/2017 | Lee | H01L 27/323 |
| 2017/0123543 A1* | 5/2017 | Choi | G06F 3/0412 |
| 2018/0122871 A1* | 5/2018 | Choi | G06F 3/0412 |
| 2018/0180724 A1* | 6/2018 | Zhang | G01S 7/521 |

OTHER PUBLICATIONS

Office Action dated Dec. 7, 2018 from the Taiwanese Patent Office in counterpart Taiwanese Application No. 10721156940.

\* cited by examiner

CENTER OF NEIGHBORING CELL AREAS

AIR BUBBLE

FLEXIBLE DISPLAY DEVICE AND METHOD OF MANUFACTURING THE SAME

This application claims the benefit of Korean Patent Application No. 10-2016-0184085, filed on Dec. 30, 2016, which is hereby incorporated by reference as if fully set forth herein.

BACKGROUND

Technical Field

The present disclosure relates to a flexible display device, and more particularly, to a flexible display device in which the configuration of an edge portion thereof is improved to prevent the generation of air bubbles remaining during processing, thereby increasing device reliability and improving folding characteristics, and a method of manufacturing the same.

Discussion of the Related Art

Concrete examples of a flat panel display device may include, for example, a liquid crystal display (LCD) device, an organic light-emitting display (OLED) device, a plasma display panel (PDP) device, a quantum dot display device, a field emission display (FED) device, and an electrophoretic display (EPD) device. These devices are alike in that they may necessarily require a flat display panel that realizes an image. Such a flat display panel typically has a configuration in which a pair of transparent insulation substrates is bonded to face each other with an inherent luminous or polarizing material or some other optical material layer therebetween.

Among these, an organic light-emitting display device, which enables a reduction in weight via omission of a light source and realizes abundant color expression, is receiving attention these days.

With the recent increase in the size of display devices, a demand for shapes of a display device that occupy a small volume of space is increasing. As this demand grows, recently, there is a demand for using a display device in a flexible form.

Accordingly, a display device is gradually thinning and is developing into a bendable or rollable flexible display device.

In addition, a display device may be required to include a touchscreen having an additional touch detection function in addition to simply having a display function, so as to meet a specific user demand.

Meanwhile, a flexible display device may undergo repeated folding operations. When cracks occur at the edges from this process, this may cause damage to the display device, with a crack at the edge acting as a seed. Therefore, efforts are being made to increase the reliability of a flexible display device at the edge portion thereof.

SUMMARY

Accordingly, the present disclosure is directed to a flexible display device and a method of manufacturing the same that substantially obviate one or more problems due to limitations and disadvantages of the related art.

An object of the present disclosure is to provide a flexible display device in which the configuration of an edge portion thereof is improved to prevent the generation of air bubbles remaining during processing, thereby increasing device reliability and improving folding characteristics, and a method of manufacturing the same.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

In a flexible display device and a method of manufacturing the same according to the present disclosure, the shape of edge portions of neighboring cell areas may be improved to stabilize bonding, to reduce stress upon folding, and to prevent, for example, cracks starting from the edge.

To achieve these objects and other advantages and in accordance with the purpose of the disclosure, as embodied and broadly described herein, a flexible display device includes a first base having an active area and a dead area surrounding the active area, the first base including a pad portion provided in the dead area on one side of the active area; an array in the active area of the first base; an encapsulation layer configured to cover the array; a second base opposite to the first base; a touch electrode array on the second base to be opposite to the active area of the first base; a plurality of path holes in the dead area on at least one of the other sides of the active area on which the pad portion is not located; an inorganic dummy pattern spaced apart from the encapsulation layer among the path holes in a plane; and an adhesive layer between the encapsulation layer and the touch electrode array to fill the path holes.

In accordance with another aspect of the present disclosure, a method of manufacturing a flexible display device includes preparing, on a first mother substrate, a plurality of cell areas each having an active area and a dead area surrounding the dead area; forming an array in the active area of each cell area of the first mother substrate and a pad portion in the dead area on one side of the cell area, and forming a plurality of path holes and an inorganic dummy pattern among the path holes in the dead area on at least one of the other sides of the cell area excluding the one side on which the pad portion is located; forming an encapsulation layer to cover the array of each of the cell areas; patterning, on a second mother substrate, a plurality of cell areas each having an active area and a dead area surrounding the dead area; forming a touch electrode array in the active area of each cell area of the second mother substrate and a touch pad portion in the dead area on one side of the polygonal cell area; forming an adhesive layer on the touch electrode array and an anisotropic conductive film on the touch pad portion; and facing and pressurizing the touch electrode array and the array for each cell area so that the touch electrode array and the array are bonded to each other by the adhesive layer and the path holes are filled with the adhesive layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
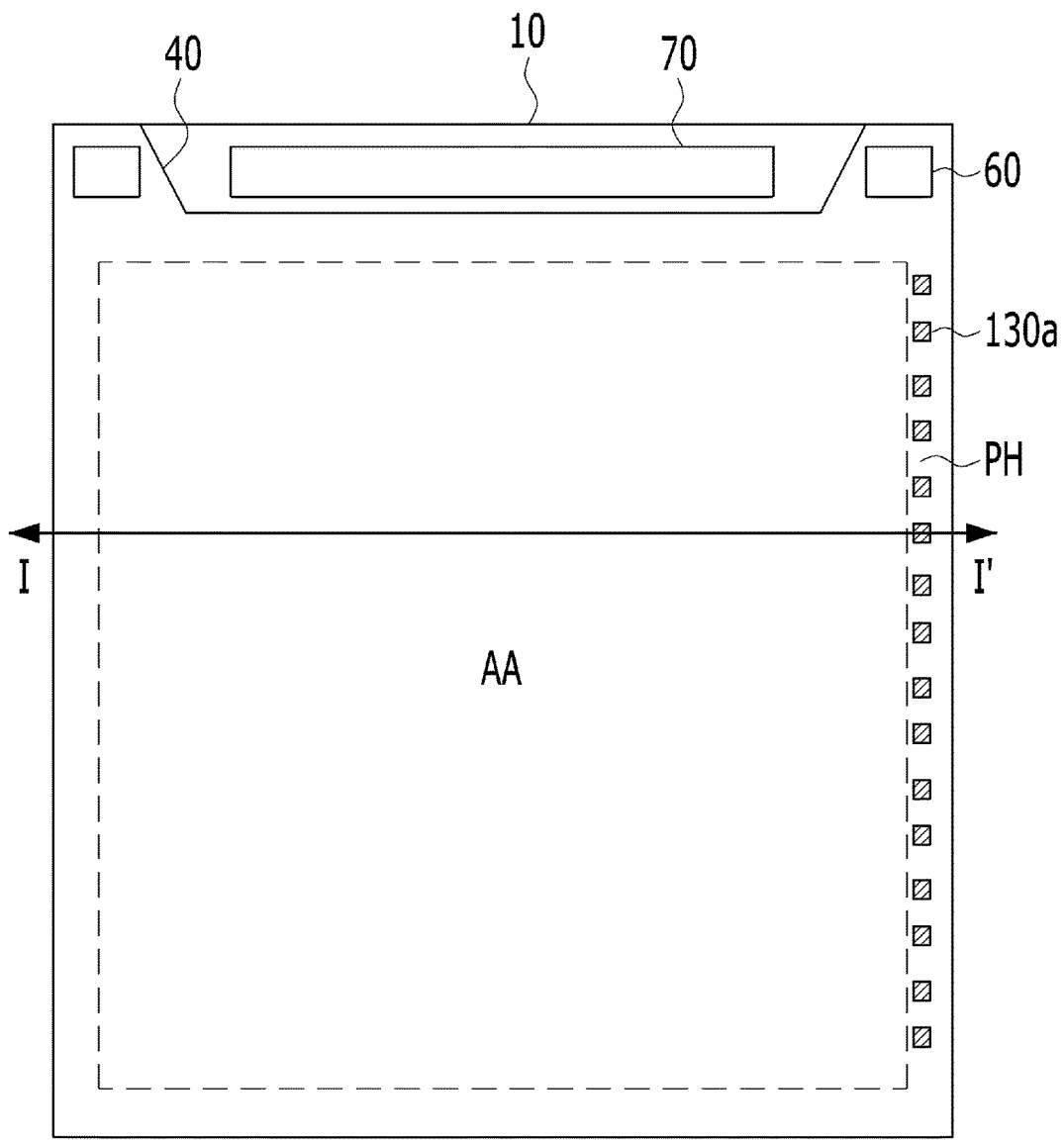
FIG. 1 is a plan view illustrating a flexible display device according to an example embodiment of the present disclosure.

Reference will now be made in detail to the example embodiments of the present disclosure, examples of which are illustrated in the accompanying drawings.

In the drawings for explaining the example embodiments of the present disclosure, for example, the illustrated shape, size, ratio, angle, and number are given by way of example, and thus, are not limited to the examples of the present disclosure. Throughout the present disclosure, the same reference numerals may designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various embodiments of the present disclosure, the constituent elements are interpreted as including an error range even if there is no explicit description thereof.

In the description of the various embodiments of the present disclosure, when describing positional relationships, for example, when the positional relationship between two parts is described using "on", "above", "below", "aside", or the like, one or more other parts may be located between the two parts unless the term "directly" or "closely" is used.

In the description of the various embodiments of the present disclosure, when describing temporal relationships, for example, when the temporal relationship between two actions is described using "after", "subsequently", "next", "before", or the like, the actions may not occur in succession unless the term "directly" or "just" is used.

In the description of the various embodiments of the present disclosure, although terms such as, for example, "first" and "second" may be used to describe various elements, these terms are merely used to distinguish the same or similar elements from each other. Therefore, in the present disclosure, an element modified by "first" may be the same as an element modified by "second" within the technical scope of the present disclosure unless otherwise mentioned.

The respective features of the various embodiments of the present disclosure may be partially or wholly coupled to and combined with each other, and various technical linkage and driving thereof are possible. These various embodiments may be performed independently of each other, or may be performed in association with each other.

Figure 2:
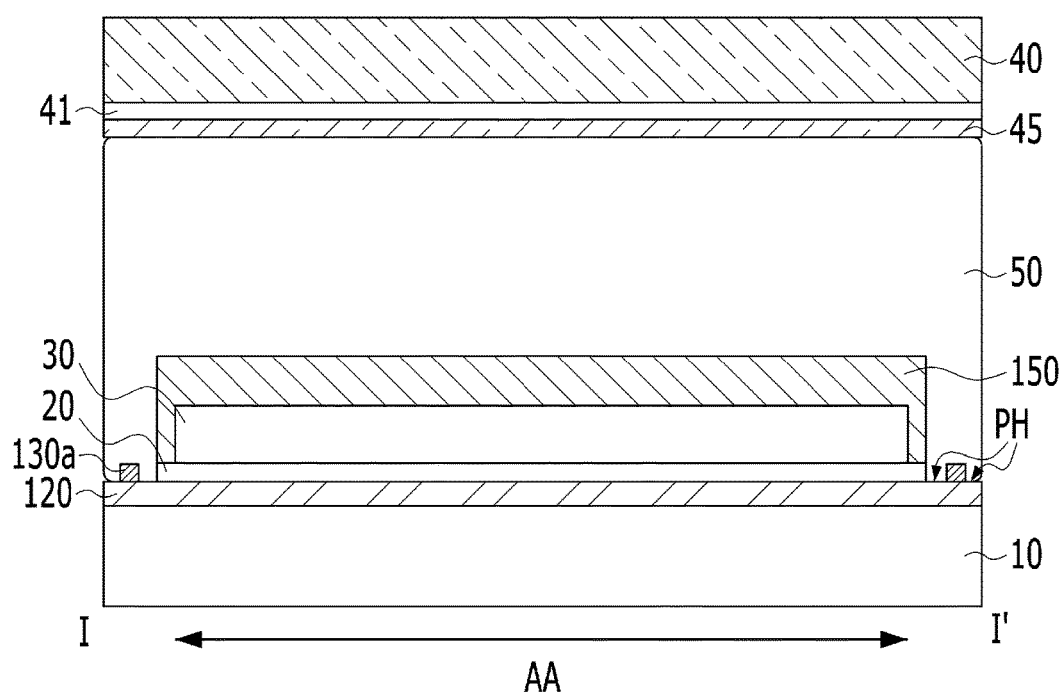
FIG. 2 is a cross-sectional view taken along line I-I' of FIG. 1.

FIG. 1 is a plan view illustrating a flexible display device according to an example embodiment of the present disclosure, and FIG. 2 is a cross-sectional view taken along line I-I' of FIG. 1.

As illustrated in FIGS. 1 and 2, the flexible display device includes a first base 10 having an active area AA in the plane of a polygon and a dead area that surrounds the active area AA, the first base 10 having an array pad portion 70 provided in the dead area along one side of the polygon, a thin-film transistor array 20 provided in the active area AA of the first base 10, an organic light-emitting diode array 30 provided on the thin-film transistor array 20, an encapsulation layer 150 that covers the organic light-emitting diode array 30, a second base 40 opposite the first base 10, a touch electrode array 45 provided on the second base 40 so as to be opposite the active area AA of the first base 10, a path hole PH located in the dead area along at least one side among the other sides of the polygon on which the array pad portion 70 of the first base 10 is not located, an inorganic dummy pattern 130*a* spaced apart from the encapsulation layer 150 with the path hole PH interposed therebetween in the same plane, and an adhesive layer 50 located between the encapsulation layer 150 and the touch electrode array 45 to fill the path hole PH.

Meanwhile, reference numeral "60" designates a touch pad portion. The pad portions are provided respectively on the first base 10 and the second base 40 and are bonded to each other by an anisotropic conductive film. To secure the flexibility of the device, a printed circuit board (not illustrated) is located on the side of the first base 10. In order to apply a signal to the touch electrode array 45, the touch pad portion 60 on the second base 40 and an auxiliary pad portion (corresponding to the touch pad portion 60) on the first base 10 are connected to each other via an anisotropic conductive film, and the signal is transmitted to the touch pad portion 60 via the auxiliary pad portion, which is electrically connected to the printed circuit board.

The polygon defined in the first base 10 may have a square shape as illustrated, or may have any other polygonal shape. Current flexible display devices generally have a rectangular screen. However, the first base 10 described in the present disclosure is not limited to a rectangular (e.g., square) shape, and the display device may be modified to various other polygonal shapes according to user demand. In addition, the display device may have rounded corners.

In addition, a portion of the second base 40 is removed, compared to the first base 10, so as to expose the array pad portion 70. The second base 40 may have a shape different from that of the first base 10, and the array pad portion 70 may be connected to the printed circuit board.

The flexible display device of an example embodiment according to an example embodiment may have a feature by which the inorganic dummy pattern 130*a* and the path hole PH are provided to allow an adhesive to uniformly spread along the edge of the first base 10, e.g. along any one or more sides of the first base 10 adjacent to the side on which the array pad portion 70 is provided upon bonding of a mother substrate in which a plurality of cell areas is defined.

Accordingly, the path hole PH may be located only along the sides of the base. On the basis of a single flexible display device, the path hole PH may be located on only one side thereof, may be located on two opposite sides, or may be located on all of the other sides excluding the side on which the array pad portion 70 is provided.

In one example, when the flexible display device corresponds to a cell area that is defined on the edge of a mother substrate, the path hole PH and the inorganic dummy pattern 130*a* may be defined on only one side. In another example, when the flexible display device corresponds to a center cell area, at opposite sides of which neighboring cell areas are defined, the path hole PH and the inorganic dummy pattern 130*a* may be defined on opposite sides.

The path hole PH may be defined simultaneously when patterning one inorganic insulation layer or a plurality of inorganic insulation layers included in the thin-film transistor array 20. A portion of the dead area, from which the inorganic insulation layer(s) is removed via patterning, is the path hole PH, and the remaining portion forms the inorganic dummy pattern 130*a*.

The first base 10 and the second base 40 may be respective plastic films, and buffer layers 120 and 41, which are formed by a plurality of inorganic layers, may be respectively provided on opposite surfaces of the first base 10 and the second base 40 on which the respective arrays (e.g. the thin-film transistor array, the organic light-emitting diode array, and the touch electrode array) thereof are provided. Reference numerals 120 and 41 represent first and second buffer layers. The buffer layers 120 and 41 may protect the thin-film transistor array, the organic light-emitting diode array, and the touch electrode array when a mother substrate, on which the respective arrays have been formed, is subsequently removed for a slim device shape.

In some cases, the first base 10 may be a backplate, and the second base 40 may be a cover window. In addition, the backplate, serving as the first base 10, may be colored or colorless, and the second base 40 may be colorless. In addition, the first and second bases 10 and 40 may be flexible films or organic layers. For example, the first base 10 may be attached to the back side of the array (including the thin-film transistor array 20 and the organic light-emitting diode array 30), from which a mother substrate has been removed, in order to protect the array, and may be a film that provides sufficient protection. In addition, the second base 40 may be an organic layer that may be patterned on a mother substrate to allow the buffer layer and the touch electrode array to be formed on previously patterned regions. Accordingly, the second base 40 may be formed by layer formation, rather than attachment, and may have a smaller thickness than the first base 10 within a range from several micrometers to 10 micrometers or less. In some cases, a cover window may be additionally attached to the upper side (the back side on which no array is formed) of the second base 40, which is a thin organic layer.

In addition, the adhesive layer 50 is applied to any one of the first base 10 and the second base 40 on which the respective arrays are formed so as to fill substantially the active area, and thereafter spreads to the dead area upon pressurization after bonding due to the spreading ability of an adhesive material. When the edge of the first base 10 has a flat inorganic layer surface, air bubbles may remain in the cell area while the adhesive layer 50 spreads. Because the portion in which air bubbles are present may cause cracks and peeling in the flexible display device when folding is repeated, in order to prevent this, in the flexible display device of an example embodiment of the present disclosure, the path hole PH is formed to structurally control the spreading of the adhesive layer 50 so that the adhesive layer 50 surrounds at least the encapsulation layer 150 without pores therein when viewed in a plan view.

In this case, the path hole PH may extend along the edge of the encapsulation layer 150.

In addition, the path hole PH may extend along the edge of the first base 10 so that the inorganic dummy pattern 130*a* is spaced apart from the edge of the first base 10. This serves to allow the adhesive layer 50 to fill the path hole PH in the edge of the first base 10, thereby securing the flexibility of the edge due to the adhesive layer 50. The adhesive layer 50 between the first base 10 and the second base 40 has a thickness of 10 µm or more and is thicker than the other layers, but may be slightly flexible after being cured because it is formed of a thermoplastic resin, thereby being capable of maintaining the shape thereof without breakage or cracks during folding.

The inorganic dummy pattern 130*a* may be spaced apart from the encapsulation layer 150 by 10 µm to 100 µm in a plane. The inorganic dummy pattern 130*a* is provided outside the encapsulation layer 150 so as to allow the adhesive layer 50 to cover an area greater than the area that is primarily protected by the encapsulation layer 150.

In addition, the inorganic dummy pattern 130*a* may be spaced apart from the edge of the first base 10 by 10 µm to 100 µm in a plane. As described above, this serves to provide the path hole PH between the inorganic dummy pattern 130*a* and the edge of the first base 10 so that the path hole PH is filled with the adhesive layer 50 so as to prevent, for example, the generation of air bubbles in the edge portion. After the adhesive layer 50 is applied, the adhesive layer 50 filled in the path hole PH spreads along the path hole PH by pressure that is applied upon bonding and pressurization of the upper and lower bases. Accordingly, the path hole PH may be integrally formed in each side of at least the first base 10.

In this case, the adhesive layer 50, which fills the path hole PH outside the edge of the encapsulation layer 150, may surround each of the thin-film transistor array 20, the organic light-emitting diode array 130, and the touch electrode array 45, whereby reduced stress may be applied to the lateral side of inorganic layers of each array upon folding. This is because, when an inorganic layer, which may have no elasticity and is fragile, remains on the edge portion, the inorganic layer may cause cracks on the edge portion when folding is repeated. In contrast, in the flexible display device according to an example embodiment of the present disclosure, a highly elastic material, such as the adhesive layer 50, may be provided on the edge portion so as to effectively remain via the path hole PH, which may alleviate stress upon folding.

Meanwhile, a plurality of inorganic dummy patterns 130*a* may be spaced apart from each other along the sides of the first base 10 excluding the side on which the pad portion is provided.

In addition, the inorganic dummy pattern 130a may be located in the same layer as an inorganic insulation layer that is included in the thin-film transistor array 20.

In some cases, when the thin-film transistor array 20 includes a plurality of inorganic insulation layers, the inorganic dummy pattern 130a may be formed in multiple layers.

In addition, the width of the inorganic dummy pattern 130a may be greater than a first distance defined by the path hole PH between the thin-film transistor array 20 and the inorganic dummy pattern 130a. This serves to allow the region, which is primarily filled with the adhesive layer 50, to be secondarily filled with the inorganic dummy pattern 130a, thereby maintaining the state of contact between the adhesive layer 50 and the inorganic dummy pattern 130a.

In order to use the path hole PH as a path along which a given adhesive layer material moves when pressurized, here, the inorganic dummy pattern 130a has an island shape, and the path hole PH may be integrally connected around the inorganic dummy pattern 130a.

Figure 3:
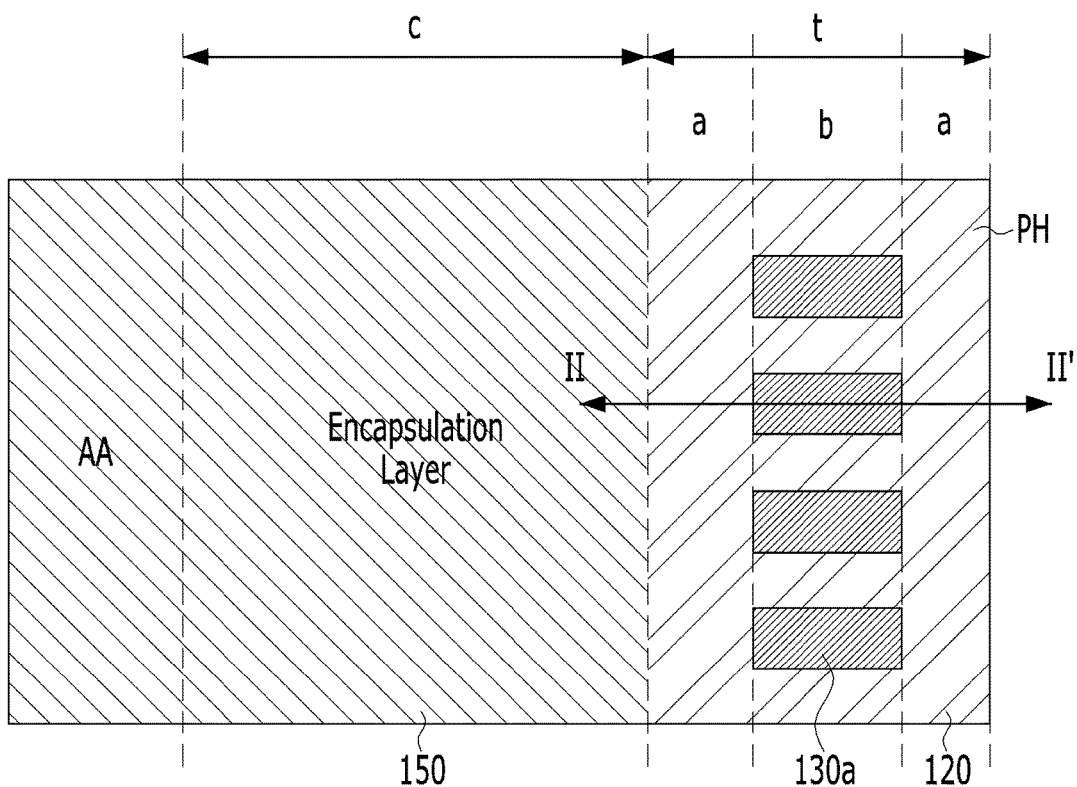
FIG. 3 is an enlarged plan view illustrating an edge portion of the flexible display device illustrated in FIG. 1.
Figure 4:
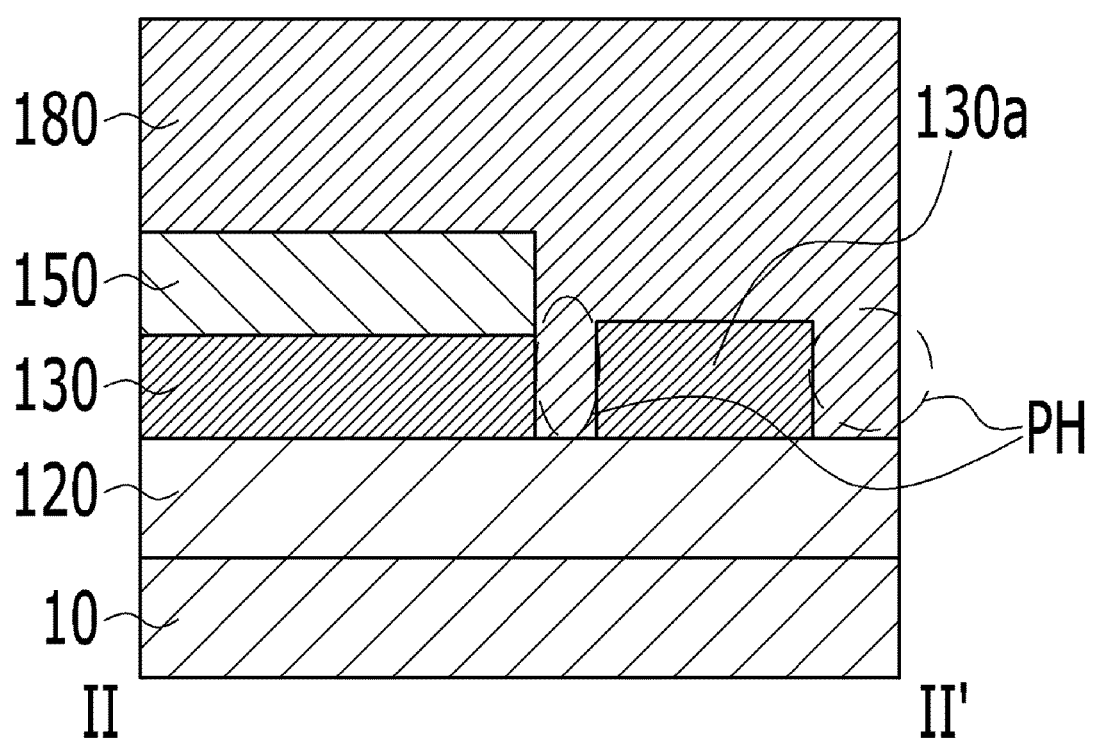
FIG. 4 is a cross-sectional view of an array base along line II-II' of FIG. 3.

FIG. 3 is an enlarged plan view illustrating the edge portion of the flexible display device illustrated in FIG. 1, and FIG. 4 is a cross-sectional view of the array base illustrated in FIG. 3 taken along line II-II'.

As illustrated in FIGS. 3 and 4, considering the edge portion of the flexible display device, in the dead area outside the active area, the encapsulation layer 150 is disposed to cover the organic light-emitting diode array 30, and the island-shaped inorganic dummy pattern 130a is spaced apart from the encapsulation layer 150.

In addition, the array (e.g., the thin-film transistor array 20) is located on the buffer layer 120 on the first base 10. The buffer layer 120 is generally provided on a first mother substrate 100 in order to protect the thin-film transistor array 20 and the organic light-emitting diode array 30 thereabove, and also functions to protect the layers thereabove when a glass substrate, which is a mother substrate, thereunder is removed. Therefore, the buffer layer 120 is provided so as to extend to the edge portion of the first base 10.

Here, the encapsulation layer 150 extends across and outward from the entire active area AA, thereby being formed on a portion of the dead area so as to sufficiently cover the organic light-emitting diode array 30.

That is, the encapsulation layer 150 protrudes from the active area AA to the dead area around the active area AA by a width of several hundred micrometers, for example, from 300 µm to 600 µm. This serves to allow the encapsulation layer 150 to sufficiently protect the organic light-emitting diode array 30, which may be vulnerable to moisture and outside air.

In addition, the island-shaped inorganic dummy pattern 130a is spaced apart from the encapsulation layer 150 by a distance "a", and the path hole PH is continuously defined around the inorganic dummy pattern 130a. In this case, the inorganic dummy pattern 130a has a width "b", which may be greater than the distance "a" between the inorganic dummy pattern 130a and the encapsulation layer 150. However, the width of the inorganic dummy pattern 130a is not limited to this example, and may be appropriately adjusted so long as an adhesive layer material may flow to fill the path hole PH without generating air bubbles in the buffer layer 120 after bonding.

Because the path hole PH is present on the edge of the encapsulation layer 150 and on the edge of the first base 10, the edge of the encapsulation layer 150 is surrounded by an adhesive layer 180 and the edge of the first base 10 is surrounded by the adhesive layer 180. When the flexible display device formed as described above is folded, the adhesive layer 180, which is an elastic material and remains on the lateral portion of the first base 10, may reduce stress upon folding.

Meanwhile, the inorganic layer 130 located on the buffer layer 120 may be formed by a plurality of inorganic insulation layers, which are included between wires of the thin-film transistor array 20 (see FIG. 2), the inorganic insulation layers are formed so as to extend to the dead area, and the inorganic dummy pattern 130a is defined by selectively removing the inorganic insulation layers. The path hole PH is located immediately close to the edge of the encapsulation layer 150 in the dead area, and the inorganic dummy pattern 130a is spaced apart from the encapsulation layer 150 by the given width of the path hole PH.

In addition, only the inorganic insulation layer may be located without wires in the portion of the dead area in which the inorganic dummy pattern 130a is formed. In this case, in the dead area, an array structure 130, which is formed from the thin-film transistor array 20, and the inorganic dummy pattern 130a may have the same height.

The inorganic dummy patterns 130a having an island shape are separately formed in the dead area, whereas the path hole PH is continuously formed between the inorganic dummy patterns 130a. Thereby, before curing, an adhesive layer material moves along the path hole PH so that the path hole PH is filled with the adhesive layer 180 without air bubbles. The adhesive layer 180 is the same as the adhesive layer 50 of FIG. 2, which remains between the path holes PH at the edge of the first base 10 when separated into individual cells. In the completed cell, the adhesive layer 50 is in a solid state after curing is completed.

FIG. 4 illustrates the dead area of the first base 10 (e.g., the base on which the array is formed). Although the second base 40 is provided above the adhesive layer 180 and the touch electrode array 45 is provided on the second base 40 so as to be opposite the first base 10, a description thereof will be omitted for convenience. FIG. 4 illustrates the adhesive layer 180 as filling the path hole PH.

Hereinafter, a method of manufacturing the flexible display device according to an example embodiment of the present disclosure will be described. In the method of manufacturing the flexible display device according to an example embodiment of the present disclosure, it should be noted that a plurality of cell areas, rather than a single cell, may be defined together and the respective cell areas are provided in a mother substrate.

Figure 5A:
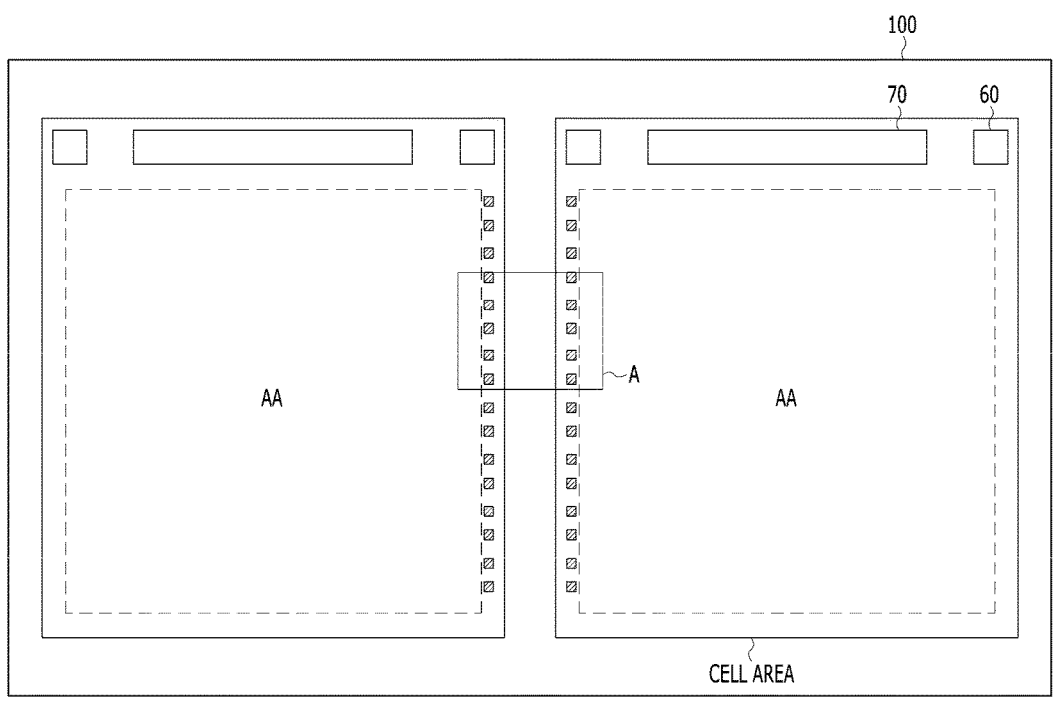
FIG. 5A is a plan view illustrating neighboring cell areas of a first mother substrate, in a method of manufacturing the flexible display device according to an example embodiment of the present disclosure.
Figure 5B:
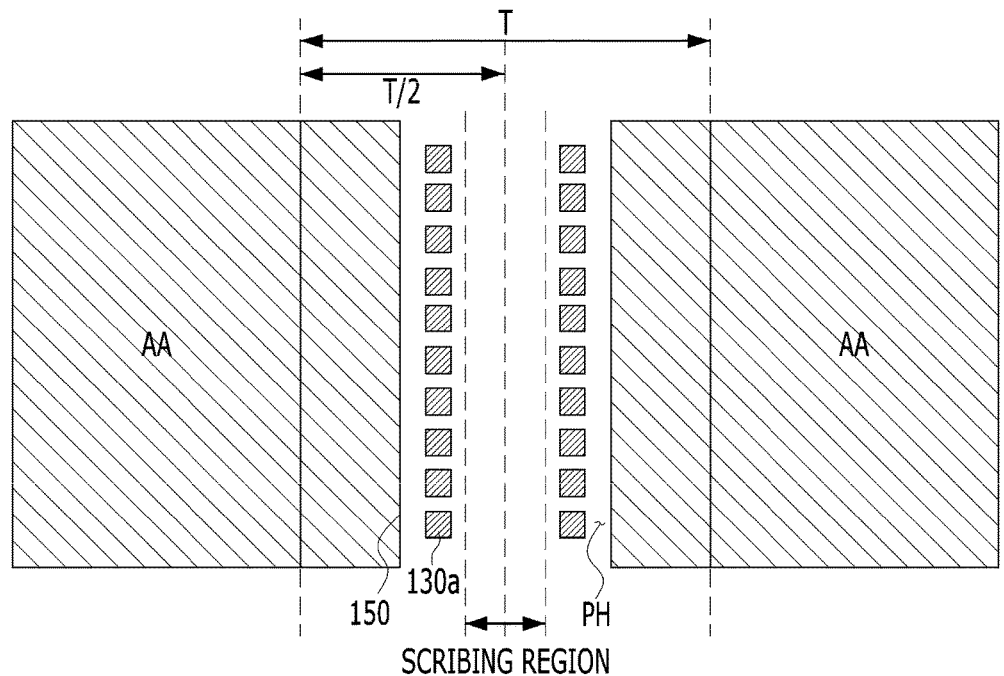
FIG. 5B is an enlarged view of area A in FIG. 5A.
Figure 6:
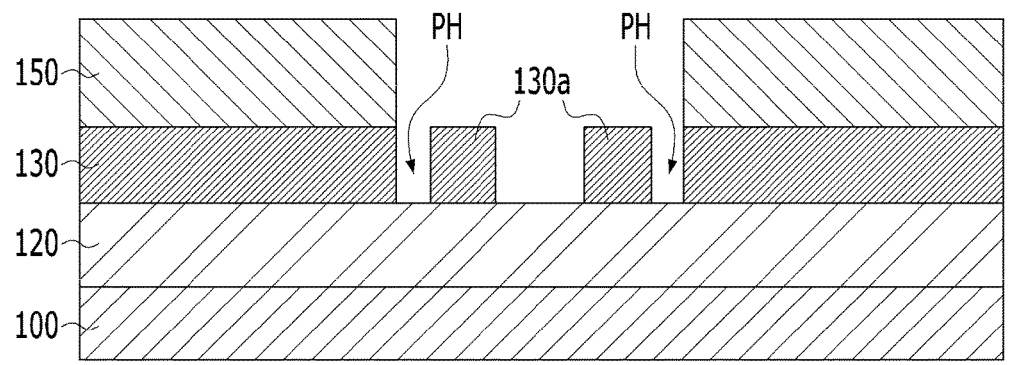
FIG. 6 is a cross-sectional view of area A in FIG. 5A.
Figure 7:
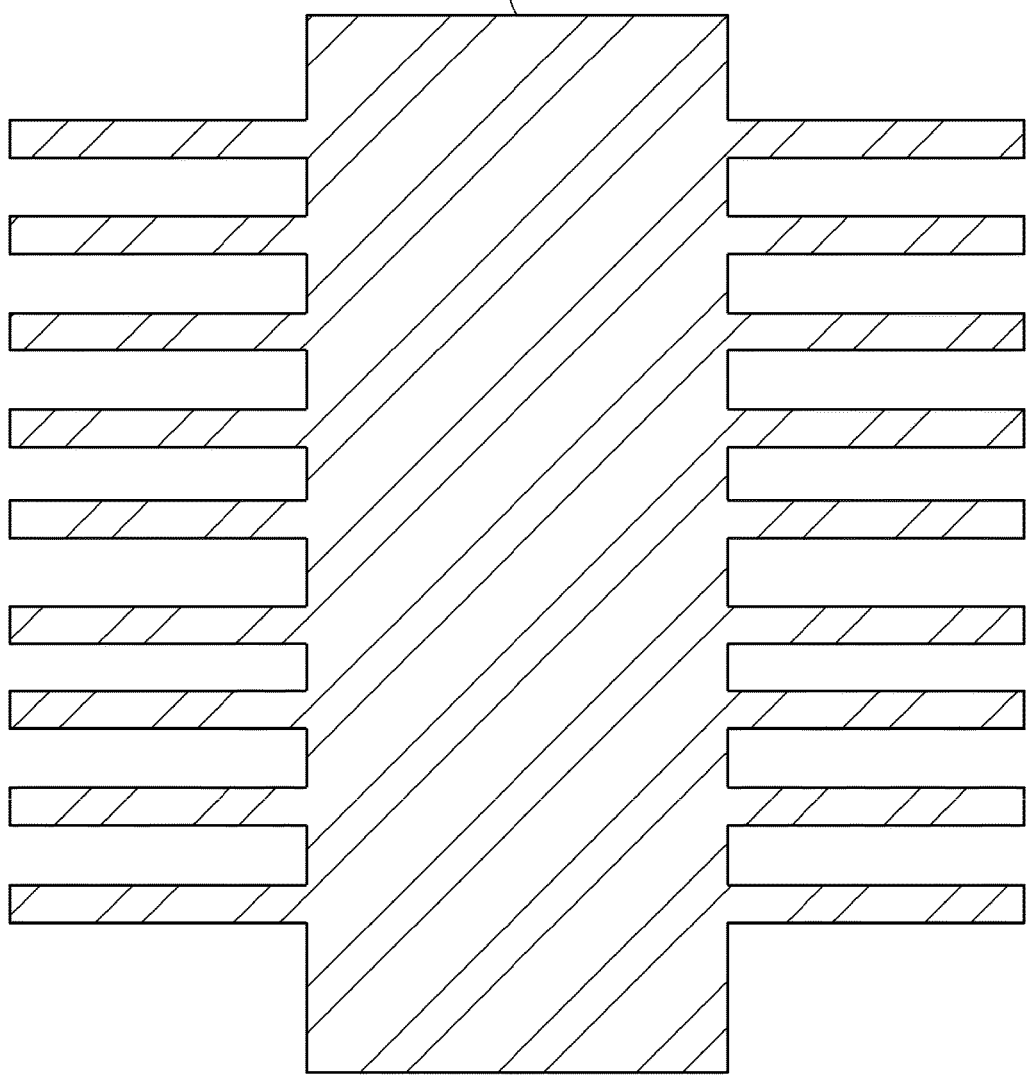
FIG. 7 is an enlarged plan view of a path hole illustrated in FIG. 5B.
Figure 8:
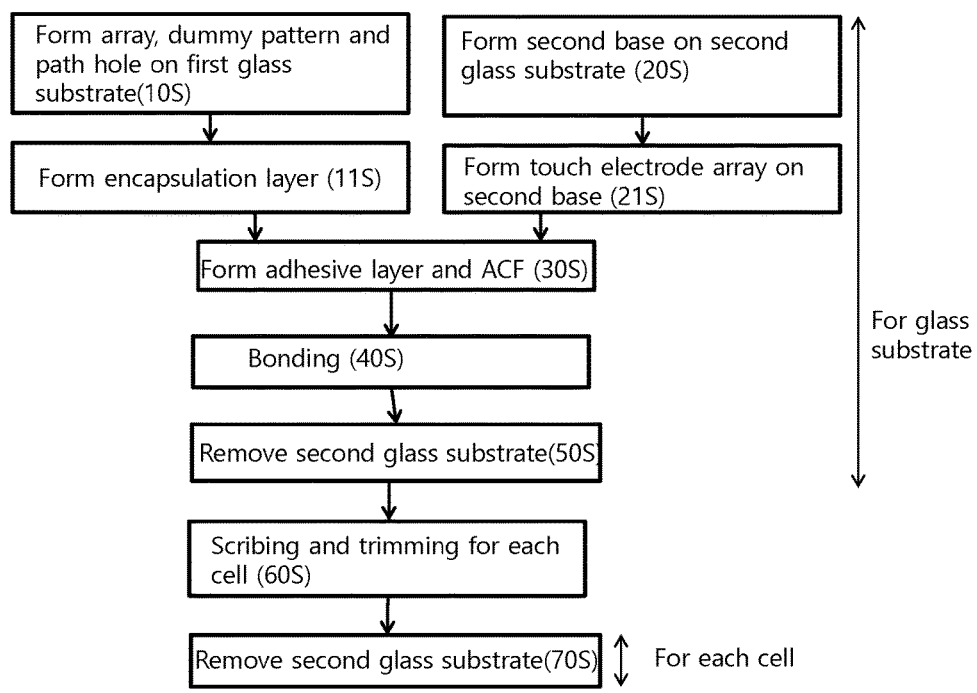
FIG. 8 is a process flowchart of the method of manufacturing the flexible display device according to an example embodiment of the present disclosure.

FIG. 5A is a plan view illustrating neighboring cell areas of a first mother substrate in the method of manufacturing the flexible display device, FIG. 5B is an enlarged view of area A in FIG. 5A, and FIG. 6 is a cross-sectional view of area A in FIG. 5A. FIG. 7 is an enlarged plan view of a path hole of FIG. 5B. In addition, FIG. 8 is a process flowchart of the method of manufacturing the flexible display device according to an example embodiment of the present disclosure. FIGS. 9A to 9E are process cross-sectional views illustrating the method of manufacturing the flexible display device from the array base side.

The method of manufacturing the flexible display device according to an example embodiment of the present disclosure is performed in the following sequence.

Although the referenced drawings illustrate an example in which a mother substrate includes two cell areas, this merely illustrates a simple configuration of manufacturing a mother substrate having a plurality of cell areas, and more than two cell areas may be repeatedly arranged along both columns and rows. Here, the mother substrate is a glass substrate having a given thickness and thus may remain hard, and serves to prevent, for example, the array or the base on the mother substrate from being deformed by heat or pressure. The mother substrate is removed after bonding.

First, as illustrated in FIG. 5A, a plurality of polygonal cell areas each having an active area AA and a dead area around the active area AA is prepared in the first mother substrate 100. In this process, the polygonal cell areas are not physically separated from each other, and an array is formed based on each cell area.

Figure 9A:
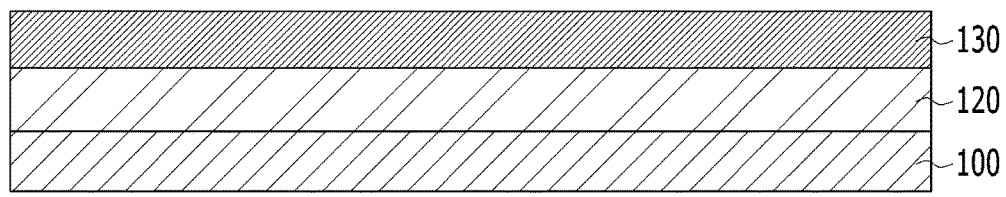
FIGS. 9A to 9E are process cross-sectional views illustrating the method of manufacturing the flexible display device according to an example embodiment of the present disclosure from the array base side.

Subsequently, as illustrated in FIG. 9A, the first buffer layer 120 is formed on the entire surface of the first mother substrate 100. Then, an array (including the thin-film transistor array 20 and the organic light-emitting diode array 30 of FIG. 1) is formed (10S) in the active area AA of each cell area, and the pad portion 70 is formed in the dead area along one side of the polygonal active area. In the same process, an auxiliary pad portion may be provided in a region that will be located opposite a touch pad portion. In addition, in the array forming process, as illustrated in FIGS. 5B and 6, the path hole PH and the inorganic dummy pattern 130a around the path hole PH are formed in the dead area along at least one of the other sides of the polygonal active area excluding the side on which the pad portion 70 is located.

Figure 9B:
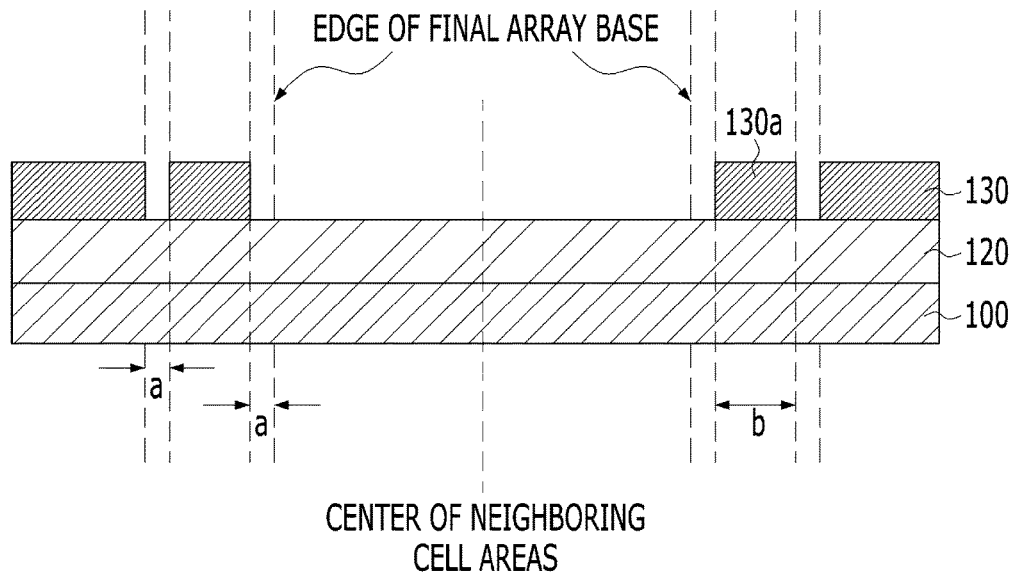

Here, as illustrated in FIG. 9B, the path hole PH is formed by selectively removing the inorganic layer 130, which protrudes from the active area AA to the dead area, and the remaining inorganic layer defines the inorganic dummy pattern 130a around the path hole PH. The inorganic layer 130 is an inorganic insulation layer, which constitutes the thin-film transistor array, and extends from the active area to the dead area. In some cases, a portion of the inorganic layer 130 may include metal wires.

Figure 9C:
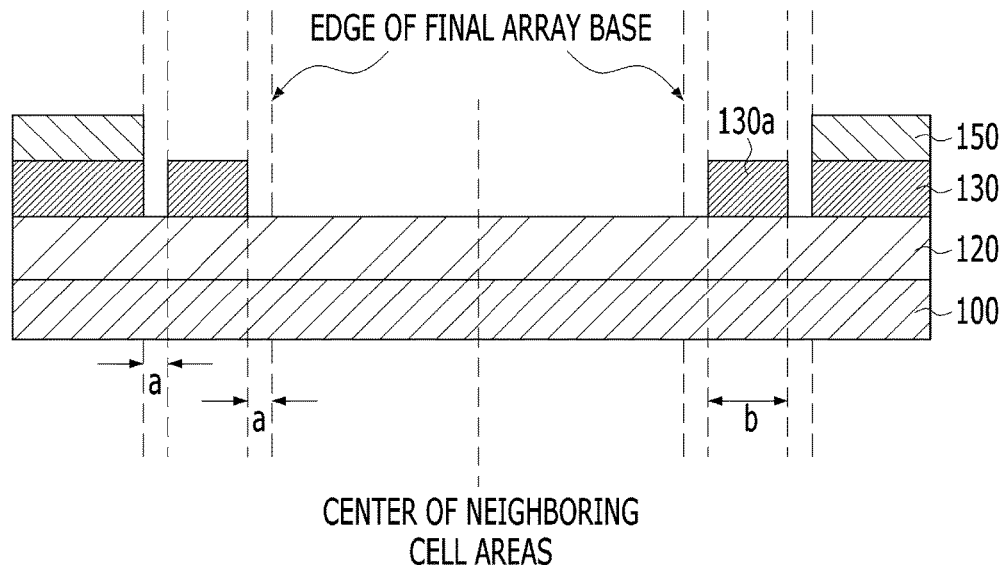

Subsequently, as illustrated in FIG. 2, the encapsulation layer 150 is formed to cover the arrays 20 and 30 in each cell area (11S). FIG. 9C illustrates only the dead area, and thus the array is invisible outside the active area. FIG. 9C illustrates the inorganic layer 130, which has been provided in the process of forming the thin-film transistor array, as extending to the dead area and the encapsulation layer 150 as being formed to the edge of the inorganic layer 130. In this case, the path hole PH and the inorganic dummy pattern 130a are located outside the encapsulation layer 150. The organic light-emitting diode array 30 is located in the active area inside the encapsulation layer 150 and is protected by the encapsulation layer 150. In FIG. 6, although the edge of the encapsulation layer 150 coincides with the edge of the inorganic layer 130 of the array, this is limited to the inorganic insulation layer of the thin-film transistor array 20, and the encapsulation layer 150 completely covers the organic light-emitting diode array 30 because the organic light-emitting diode array 30 is formed in the active area AA. That is, the encapsulation layer 150 protrudes outward from the edge of the organic light-emitting diode array 30 by 300 µm to 600 µm, thereby preventing moisture and outside air from permeating the organic light-emitting diode array 30.

The encapsulation layer 150 may be, for example, a stack in which one or more pairs of inorganic layers and organic layers are alternately stacked one above another, and the uppermost (outermost) layer is an inorganic layer in order to directly prevent the permeation of outside air.

Figure 9D:
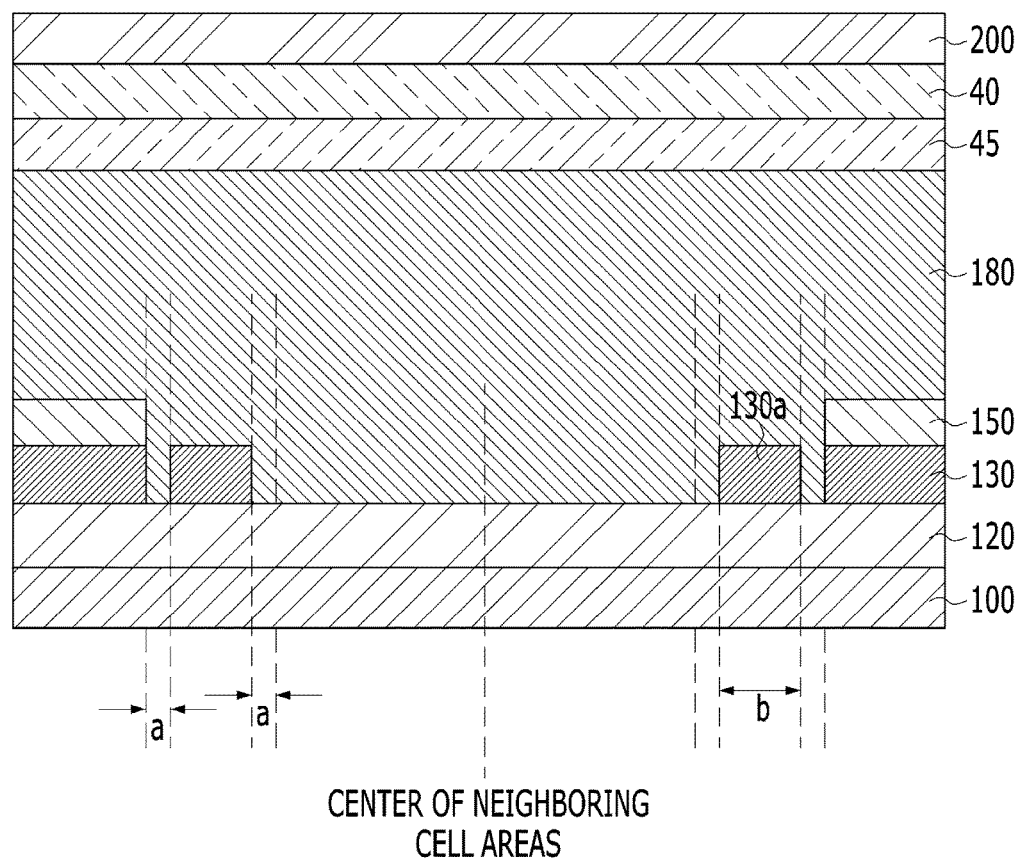

Subsequently, as illustrated in FIG. 9D, the second base 40 (see FIGS. 1 to 4) is patterned on a second mother substrate 200, which is parallel to the first mother substrate 100, so as to form a plurality of polygonal cell areas each having an active area AA and a dead area around the active area AA (20S). As illustrated in FIG. 1, the shape of the second base 40 is defined so as to open the pad portion 70 defined in the first mother substrate 100. Here, the second base 40 may be patterned via, for example, a photo-process. The second base 40, which is formed by an organic layer, is directly formed on the second mother substrate. When the second base 40 remains after the second mother substrate is removed, formation of the second base 40 may be implemented without using a separate film, and thus the thickness of the second base 40 may be reduced to several micrometers, which is several tens of times smaller than the thickness in a structure in which the second base 40 is formed using a film. Accordingly, the above-described structure may be advantageous for flexibility.

The second buffer layer 41 may be further provided on the second base 40 (see FIG. 2). Because the second base 40 is patterned and located on the second mother substrate 200, the second base 40 may serve to protect an array in the process of forming a touch electrode array on the second mother substrate (e.g., plate) 200. Thus, the second buffer layer 41 may be omitted.

Subsequently, the touch electrode array 45 is formed in the active area of each cell area on the second base 40 and the touch pad portion 60 is formed in the dead area along one side of the polygonal active area on the second base 40 (21S).

Subsequently, the adhesive layer 180 is formed on the touch electrode array 45 and an anisotropic conductive film (ACF) (not illustrated) is formed on the touch pad portion 60 (30S).

Subsequently, as illustrated in FIG. 9D, the touch electrode array 45 and the array (including the thin-film transistor array 20 and the organic light-emitting diode array 30) of the respective cell areas of the first mother substrate 100 and the second mother substrate 200 are arranged to face each other and are pressed against each other so that the touch electrode array 45, the thin-film transistor array 20, and the organic light-emitting diode array 30 are bonded to each other by the adhesive layer 180. In the bonding process, the path hole PH may be filled with the pressurized adhesive layer 180. The adhesive layer 180 is formed of a thermosetting resin, and is primarily applied in a liquid phase and then moves along the path hole PH to thereby laterally fill the space between neighboring cell areas under a high-temperature and high-pressure condition during bonding. Thereafter, the cured adhesive layer 180 may prevent a moisture permeation path from being generated from the edge due to cracks, which are generated upon receiving external shocks. In the same process, the touch pad portion 60 on the second base 40 and the auxiliary pad portion on the first mother substrate 100 are bonded to each other by the anisotropic conductive film (40S).

Meanwhile, the portions of neighboring cell areas in which the pad portion 70 and the touch pad portion 60 are not located share the path hole PH before scribing, and a scribing line may pass through the path hole PH.

Subsequently, the second mother substrate 200 is removed by irradiating the upper side thereof with a laser in the state in which the first and second mother substrates 100 and 200 are bonded to each other (50S). Once the second mother substrate 200 has been removed (50S), the touch electrode array 45 on the second base 40, which is patterned in a divided form, remains in the state in which it is bonded to the encapsulation layer 150 including the arrays 20 and 30. That is, in this process, the second base 40 and the touch electrode array 45 are divided on a per-cell-area basis, and the lower arrays 20 and 30 remain on the first mother substrate 100 without distinction of cell areas.

Figure 9E:
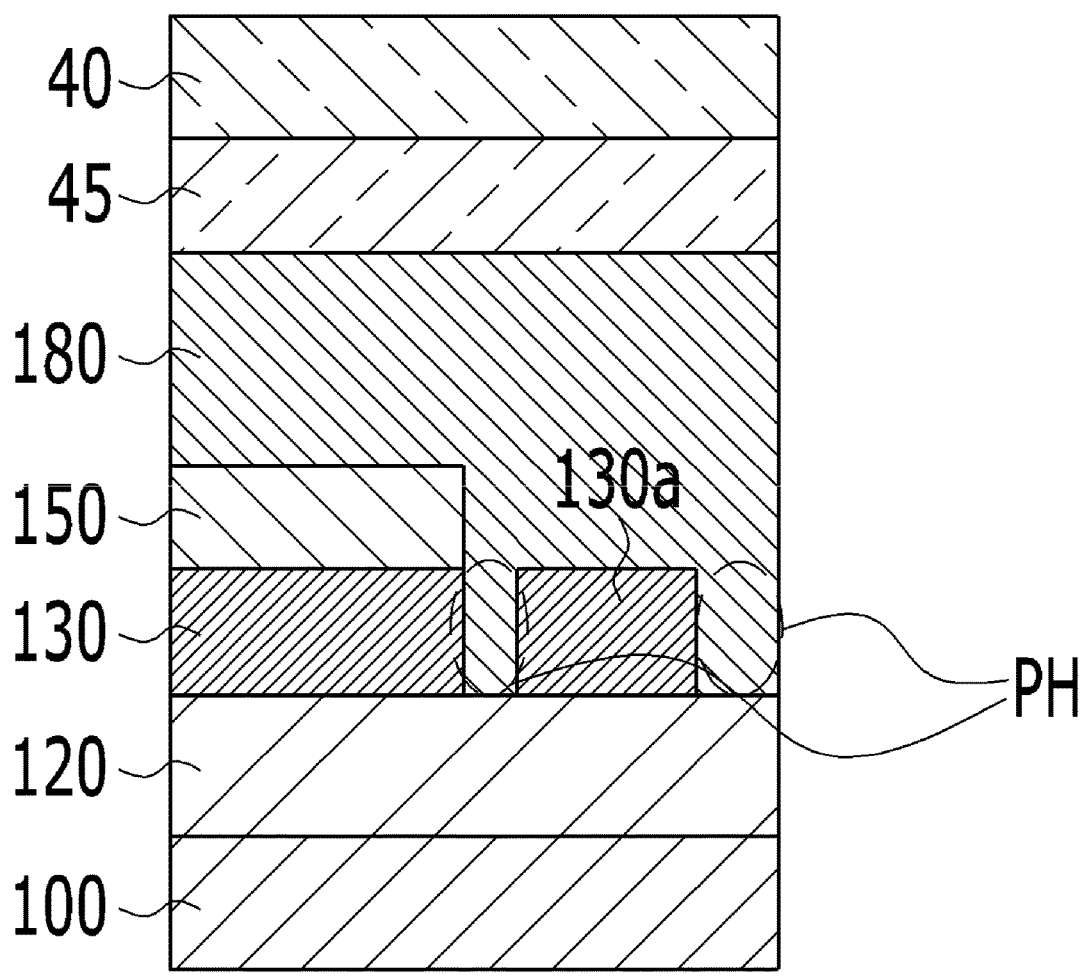

Subsequently, as illustrated in FIG. 9E, scribing is performed for each cell area illustrated in FIG. 5A (60S). In the scribing step, as illustrated in FIGS. 5B to 7, the portions of neighboring cell areas in which no pad portion and no touch pad portion are located share the path hole PH, and the scribing line may pass through the path hole PH. Although scribing is generally considered as being performed in a line form because the resulting structure is referred to as the "scribing line", a region having a width of approximately 1000 μm between the neighboring cell areas is removed by scribing in an actual process. After the primary scribing, the cell areas are subjected to trimming in order to precisely form the edge of each cell area, and a region having a width from 100 μm to 200 μm may be further removed for edge adjustment (60S).

In this case, in the scribing step, the scribing and the trimming are performed such that the edge of the cell area protrudes by 10 μm to 100 μm from the edge of the inorganic dummy pattern 130a in each cell area. Here, the adhesive layer 180, which remains in each cell area after the scribing step, may stably surround the arrays 20 and 30 and the touch electrode array 45 without air bubbles.

Subsequently, the lower side of the first mother substrate 100 is irradiated with a laser for each cell area so that the first mother substrate 100 is removed for each scribed cell area (70S).

In addition, as illustrated in FIG. 2, the first base 10 (see FIG. 2) is attached to the lower side of the first buffer layer 120, which is exposed after the first mother substrate 100 is removed, so as to secure surface protection.

Hereinafter, an example in which the inorganic dummy pattern 130a and the path hole PH around the same are formed as in the method of manufacturing the flexible display device according to an example embodiment of the present disclosure, and a comparative example in which the method of manufacturing the flexible display device according to an example embodiment of the present disclosure is not applied will be compared with each other based on the state after bonding and pressurization of neighboring cell areas.

Figure 10A:
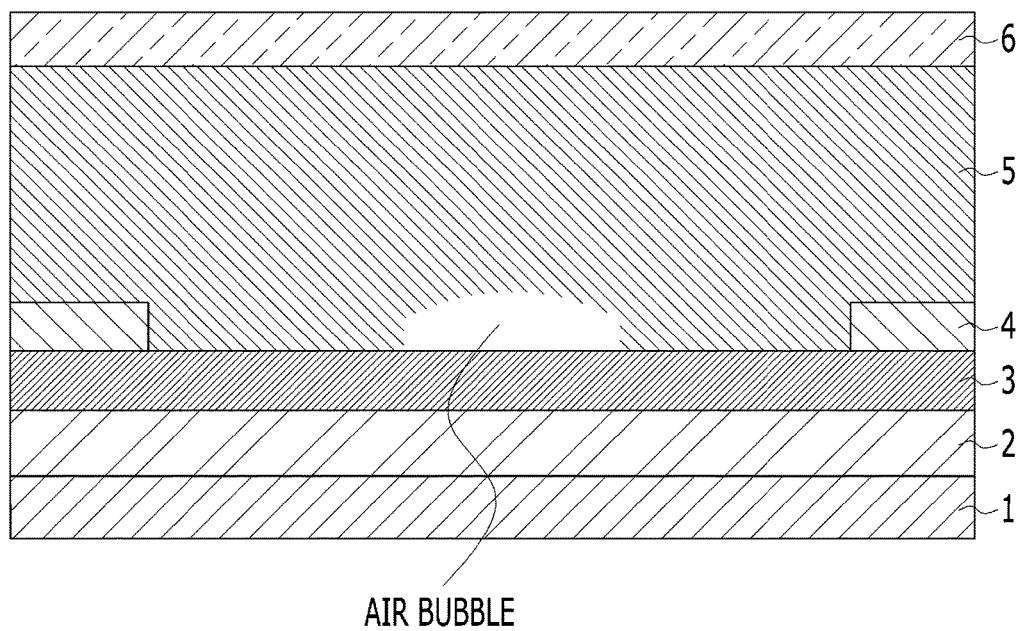
FIGS. 10A and 10B are cross-sectional views illustrating a comparative example and the edge portion after first and second mother substrates are bonded to each other using an adhesive layer and are then pressurized, in the method of manufacturing the flexible display device of the present disclosure.
Figure 10B:
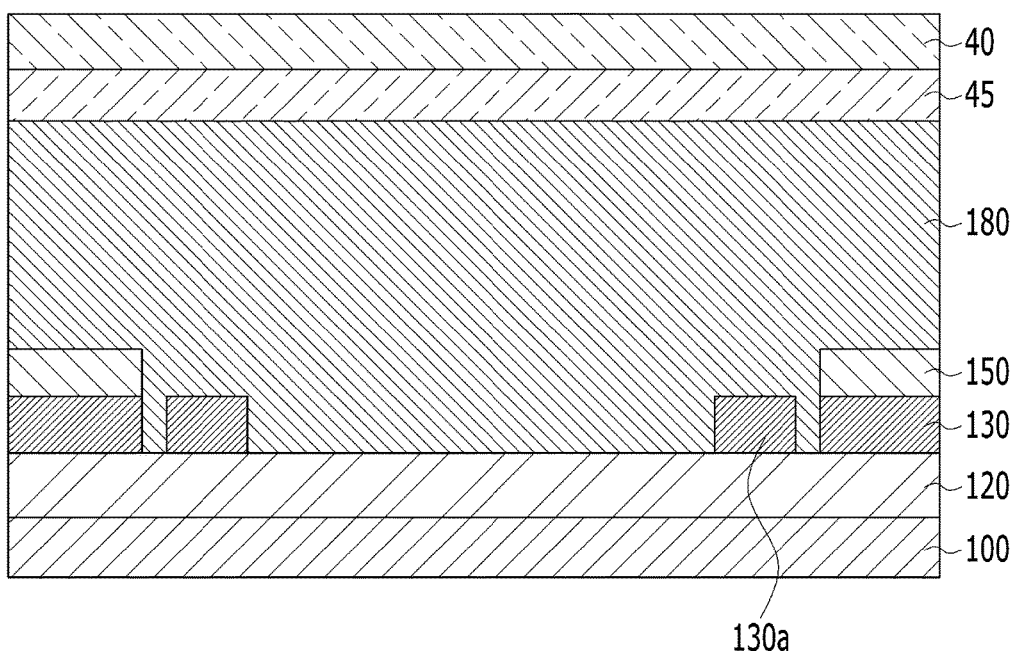

FIGS. 10A and 10B are cross-sectional views illustrating the edge portion after the first and second mother substrates are bonded to each other using the adhesive layer and are pressurized, according to a comparative example and the method of manufacturing the flexible display device according to an example embodiment of the present disclosure.

As illustrated in FIG. 10A, in the comparative example, when a flat inorganic layer 3 is located between neighboring cell areas after bonding, an adhesive layer material 5 spreads upon receiving pressure, but creates a region that is not filled therewith. This region causes the generation of air bubbles. Therefore, the air bubbles may cause damage to the neighboring cell areas during scribing after bonding, and when folding is repeated, may cause peeling of an adhesive layer as well as cracks from the edge.

As illustrated in FIG. 10B, when the method of manufacturing the flexible display device according to an example embodiment of the present disclosure is applied, a region that is not filled with the adhesive layer between neighboring cell areas is not formed, and furthermore, air bubbles are not formed. Therefore, peeling of the adhesive layer or cracks from the edge, as described above, may be prevented.

As is apparent from the above description, a flexible display device and a method of manufacturing the same may have the following effects.

First, in dead areas of neighboring cell areas, a portion of an inorganic layer is removed to form a path hole. Thereby, the path hole is filled with a sufficient amount of adhesive via pressurization, which may prevent air bubbles from remaining in each cell area after scribing.

Second, in the edge portion of each cell area, an adhesive layer, which is relatively flexible and exerts excellent adhesive force, fills the space between inorganic layers. Therefore, even if folding is repeated, for example, the formation of cracks in the edge portion may be prevented, which may result in improved folding characteristics.

Third, when an inorganic insulation layer, which constitutes an array, is patterned, an inorganic dummy pattern may be defined via patterning in the dead area without adding a separate process, which may increase device reliability.

It will be apparent to those skilled in the art that various modifications and variations can be made in the flexible display device and method of manufacturing the same of the present disclosure without departing from the spirit or scope of the disclosure. Thus, it is intended that the present disclosure cover the modifications and variations of this disclosure provided they come within the scope of the appended claims and their equivalents.

What is claimed is:

1. A flexible display device, comprising:
a first base having an active area and a dead area surrounding the active area, the first base including a pad portion provided in the dead area on one side of the active area;
an array in the active area of the first base;
an encapsulation layer configured to cover the array;
a second base opposite to the first base;
a touch electrode array on the second base to be opposite to the active area of the first base;
a plurality of path holes in the dead area on at least one of the other sides of the active area on which the pad portion is not located;
an inorganic dummy pattern spaced apart from the encapsulation layer among the path holes in a plane; and
an adhesive layer between the encapsulation layer and the touch electrode array to fill the path holes,
wherein the adhesive layer fills the path holes outside an edge of the encapsulation layer to surround the array and the touch electrode array.

2. The flexible display device according to claim 1, wherein the inorganic dummy pattern is spaced apart from an edge of the first base.

3. The flexible display device according to claim 2, wherein the inorganic dummy pattern is spaced apart from the edge of the first base by 10 μm to 100 μm in a plane.

4. The flexible display device according to claim 1, wherein the inorganic dummy pattern is spaced apart from the encapsulation layer by 10 μm to 100 μm in the plane.

5. The flexible display device according to claim 1, wherein the inorganic dummy pattern includes a plurality of inorganic dummy patterns spaced apart from one another along sides of the first base excluding the pad portion.

6. The flexible display device according to claim 1, wherein the inorganic dummy pattern is in a same layer as an inorganic insulation layer included in the array.

7. The flexible display device according to claim 1, wherein the inorganic dummy pattern includes a plurality of layers.

8. The flexible display device according to claim 1, wherein each of the path holes has a first distance between the array and the inorganic dummy pattern, and the first distance is smaller than a width of the inorganic dummy pattern.

9. The flexible display device according to claim 8, wherein the inorganic dummy pattern has an island shape, and
wherein the path holes are integrally connected around the inorganic dummy pattern.

10. The flexible display device according to claim 1, wherein the array includes a thin-film transistor array and an organic light-emitting diode array.

11. A method of manufacturing a flexible display device, the method comprising:
preparing, on a first mother substrate, a plurality of cell areas each having an active area and a dead area surrounding the dead area;
forming an array in the active area of each cell area of the first mother substrate and a pad portion in the dead area on one side of the cell area, and forming a plurality of path holes and an inorganic dummy pattern among the path holes in the dead area on at least one of the other sides of the cell area excluding the one side on which the pad portion is located;
forming an encapsulation layer to cover the array of each of the cell areas;
patterning, on a second mother substrate, a plurality of cell areas each having an active area and a dead area surrounding the dead area;
forming a touch electrode array in the active area of each cell area of the second mother substrate and a touch pad portion in the dead area on one side of each of the cell areas;
forming an adhesive layer on the touch electrode array and an anisotropic conductive film on the touch pad portion; and
facing and pressurizing the touch electrode array and the array for each cell area so that the touch electrode array and the array are bonded to each other by the adhesive layer and the path holes are filled with the adhesive layer.

12. The method according to claim 11, further comprising:
removing the second mother substrate;
scribing each cell area; and
removing the first mother substrate.

13. The method according to claim 12, wherein, in the scribing, regions of neighboring cell areas in which the pad portion and the touch pad portion are not located share the path holes, and a scribing line passes through the path holes.

14. The method according to claim 13, wherein the scribing is performed such that an edge of each cell area protrudes from an edge of the inorganic dummy pattern of the cell area by 10 µm to 100 µm.

15. The method according to claim 12, further comprising trimming edges of the cell areas after the scribing.

16. The method according to claim 15, wherein, in the trimming, an edge of each cell area remains so as to protrude from an edge of the inorganic dummy pattern of the cell area by 10 µm to 100 µm.

17. The method according to claim 12, wherein, after the scribing, the adhesive layer in each cell area surrounds the array and the touch electrode array.

18. The method according to claim 11, wherein the inorganic dummy pattern is spaced apart from the encapsulation layer by 10 µm to 100 µm in a plane.

19. The method according to claim 11, wherein the forming the path holes and the inorganic dummy pattern among the path holes includes selectively removing an inorganic layer, which protrudes from the active area to the dead area, so that the removed inorganic layer forms the path holes and the remaining inorganic layer forms the inorganic dummy pattern.

* * * * *